United States Patent
Toniolo et al.

(10) Patent No.: US 8,461,448 B2
(45) Date of Patent: Jun. 11, 2013

(54) SOLAR CELL MODULE

(75) Inventors: Paolo Toniolo, Cesate (IT);
Padmanabhan Srinivasan, Milan (IT);
Alessio Marrani, Lecco (IT);
Giambattista Besana, Mariano Comense (IT); Vincenzo Arcella, Nerviano Milano (IT)

(73) Assignee: Solvay Specialty Polymers Italy S.p.A., Bollate (IT)

( * ) Notice: Subject to any disclaimer, the term of this patent is extended or adjusted under 35 U.S.C. 154(b) by 649 days.

(21) Appl. No.: 12/594,525

(22) PCT Filed: Apr. 4, 2008

(86) PCT No.: PCT/EP2008/054117
§ 371 (c)(1),
(2), (4) Date: Oct. 2, 2009

(87) PCT Pub. No.: WO2008/122619
PCT Pub. Date: Oct. 16, 2008

(65) Prior Publication Data
US 2010/0116927 A1      May 13, 2010

(30) Foreign Application Priority Data
Apr. 6, 2007   (EP) ...................................... 07105822

(51) Int. Cl.
*H01L 31/042*   (2006.01)
(52) U.S. Cl.
USPC .......................................... 136/244; 136/251
(58) Field of Classification Search
USPC .................... 136/244, 251; 525/200; 526/247
See application file for complete search history.

(56) References Cited

U.S. PATENT DOCUMENTS

| 4,578,526 A | 3/1986 | Nakano et al. |
| 5,466,301 A | 11/1995 | Hammerbacher et al. |

(Continued)

FOREIGN PATENT DOCUMENTS

| EP | 0658943 A1 | 6/1995 |
| EP | 0680097 | * 11/1995 |

(Continued)

OTHER PUBLICATIONS

Pucciariello R; Mancusi C—'Extreme Thermal Behaviors of Polytetrafluoroethylene and Random Tetrafluoroethylene Fluorinated Copolymers'—Journal of Applied Polymer Science, (1999), vol. 73, pp. 919-925, 7 pages.

(Continued)

*Primary Examiner* — Mark Kopec
(74) *Attorney, Agent, or Firm* — Arent Fox LLP

(57) ABSTRACT

The present invention pertains to a solar cell module comprising at least one photovoltaic element encapsulated between a front layer on its light receiving surface side and a back layer, said front layer comprising at least one layer comprising a tetrafluoroethylene (TFE) polymer [polymer (F)], said polymer (F) comprising: recurring units derived from TFE; and from 15 to 25% wt of recurring units derived from at least one perfluoromonomer [monomer (CM)] chosen among: (i) perfluoroalkylvinylethers complying with formula $CF_2=CFOR_{f1}$, in which $R_{f1}$ is a $C_1$-$C_6$ perfluoroalkyl, e.g. $-CF_3$, $-C_2F_5$, $-C_3F_7$; and/or (ii) perfluoro-oxyalkylvinylethers complying with formula $CF_2=CFOX_0$, in which $X_0$ is a $C_1$-$C_{12}$ perfluorooxyalkyl having one or more ether groups, like perfluoro-2-propoxy-propyl; and (iii) mixtures thereof. Still objects of the invention are a process for the manufacture of the solar cell module as above defined and its use for producing current to external sources, e.g. for powering a fixed-wing aircraft.

15 Claims, 1 Drawing Sheet

U.S. PATENT DOCUMENTS

| | | | |
|---|---|---|---|
| 5,530,264 A | 6/1996 | Kataoka et al. | |
| 5,578,141 A | 11/1996 | Mori et al. | |
| 5,582,653 A | 12/1996 | Kataoka et al. | |
| 5,597,422 A | 1/1997 | Kataoka et al. | |
| 5,650,019 A * | 7/1997 | Yamada et al. | 136/251 |
| 5,660,645 A | 8/1997 | Mori et al. | |
| 5,800,631 A * | 9/1998 | Yamada et al. | 136/251 |
| 6,331,673 B1 | 12/2001 | Kataoka et al. | |
| 6,340,403 B1 | 1/2002 | Carey et al. | |
| 6,538,084 B2 * | 3/2003 | Kitahara et al. | 526/250 |
| 7,855,254 B2 * | 12/2010 | Abusleme et al. | 525/199 |
| 2004/0147676 A1 | 7/2004 | Irie et al. | |
| 2004/0261836 A1 | 12/2004 | Kataoka et al. | |
| 2005/0090598 A1 | 4/2005 | Tanaka et al. | |
| 2005/0178428 A1 | 8/2005 | Laaly et al. | |
| 2005/0268961 A1 | 12/2005 | Hetzler et al. | |
| 2005/0274410 A1 | 12/2005 | Yuuki et al. | |
| 2011/0201774 A1 * | 8/2011 | Kitahara et al. | 526/247 |

FOREIGN PATENT DOCUMENTS

| | | |
|---|---|---|
| EP | 0992518 A1 | 4/2000 |
| EP | 1245657 A1 | 10/2002 |
| EP | 1306407 A1 | 5/2003 |
| EP | 1612236 A1 | 1/2006 |
| EP | 1666524 A1 | 6/2006 |

OTHER PUBLICATIONS

Standard—ASTM D1238—'Standard Test Method for Melt Flow Rates of Thermoplastics by Extrusion Plastometer', Oct. 2001, 14 pages.

Standard—ASTM D3418—'Standard Test Method for Transition Temperatures of Polymers by Differential Scanning Calorimetry', Jan. 2004, 8 pages.

* cited by examiner

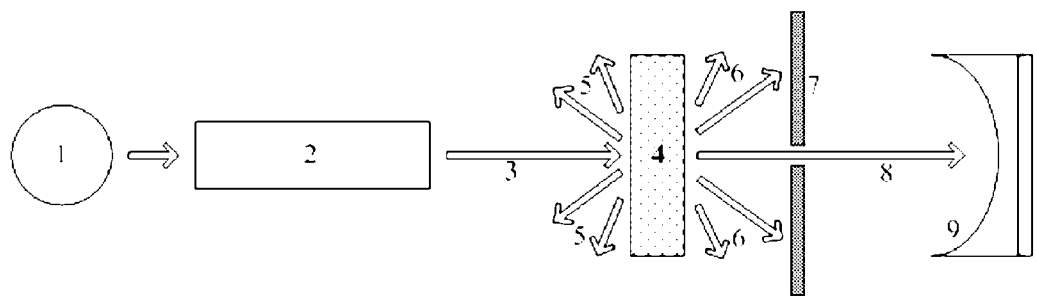
Fig. 1
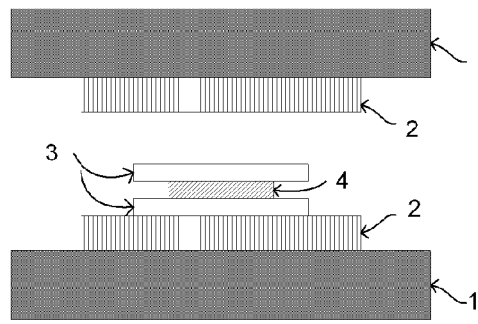
Fig. 2 (A)
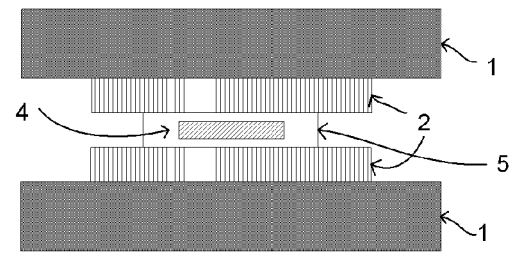
Fig. 2 (B)
Fig. 2
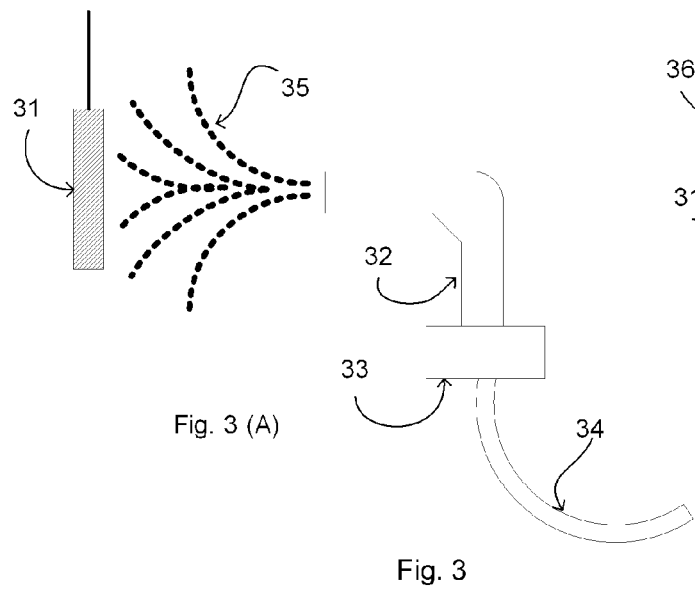
Fig. 3 (A)
Fig. 3 (B)
Fig. 3

SOLAR CELL MODULE

TECHNICAL FIELD

CROSS-REFERENCE TO RELATED APPLICATIONS

This application is a U.S. national stage application under 35 U.S.C. §371 of International Application No. PCT/EP2008/054117 filed Apr. 4, 2008, which claims priority to European Application No. 07105822.6 filed Apr. 6, 2007, these applications being incorporated herein by reference in their entirety for all purposes.

BACKGROUND ART

In recent years, heating of the earth because of the so-called greenhouse effect due to an increase of atmospheric $CO_2$ has been predicted. In view of this, there is an increased demand for means of power generation capable of providing clean energy without causing $CO_2$ buildup. In this regard, nuclear power generation has been considered to be advantageous in view of not causing $CO_2$ buildup. However, there are problems for nuclear power generation in that it unavoidably produces radioactive wastes which are harmful for living things and there is a probability that leakage of injurious radioactive materials from the nuclear power generation system will happen when the system is damaged. Therefore, there is an increased societal demand for early realization of a power generation system capable of providing clean energy without causing $CO_2$ buildup as in the case of thermal power generation and without causing radioactive wastes and radioactive materials as in the case of nuclear power generation.

There have been various proposals which are expected to meet such societal demand. Among those proposals, solar cells (photoelectric conversion elements, in other words) are expected to be a future power generation source since they supply electric power without causing above mentioned problems.

A variety of solar cells for commercial and home appliances have been proposed. These solar cells include single crystal silicon solar cells, polycrystal silicon solar cells, amorphous silicon solar cells, copper indium selenide solar cells, and compound semiconductor solar cells. Of these solar cells, various studies have been made on so-called thin film crystal silicon solar cells, compound semiconductor solar cells and amorphous silicon solar cells since their semiconductor active layer can be relatively easily formed in a large area and in a desired form and they therefore can be easily produced at a relatively low production cost.

Particularly, thin film amorphous solar cells, specifically, amorphous silicon solar cells, comprising a metal substrate, an amorphous silicon semiconductor active layer disposed on said metal substrate, and a transparent and conductive layer disposed on said semiconductor active layer have been evaluated as being the most advantageous among the conventional solar cells because their semiconductor active layer comprised of amorphous silicon (hereinafter referred to as a-Si) can be easily formed in a large area and in a desired form on a relatively inexpensive substrate with a low production cost and they are light and excel in shock resistance and flexibility, and in addition, they can be designed into a solar cell module in a desired configuration which can be used as a power generation source.

Now, especially in the case of an amorphous silicon solar cell having a semiconductor active layer comprising, for example, an a-Si thin film disposed on a glass plate as a substrate, light is impinged through the substrate side, and because of this, the glass plate can be designed to serve as a protective member. However, in the case of the aforementioned solar cell having the a-Si semiconductor active layer disposed on the metal substrate, because the metal substrate does not permit incident light to transmit therethrough, light is impinged through the side opposite the metal substrate, and therefore, it is necessary to arrange an appropriate transparent protective member on the side through which light is impinged such that it protects the solar cell element. A transparent fluorine-containing polymer film comprised of a fluororesin or of a fluororesin-containing composition is conventionally used as the surface protective member; often, a transparent thermoplastic resin is used as a filler under the transparent fluorine-containing polymer film to provide for suitable adhesion on the uneven surface of the photoactive element.

Fluorine-containing polymer films have been used successfully as they are satisfactory in terms of weatherability and water-repellency. Fluoropolymer films help in diminishing deterioration of photoelectric conversion efficiency of the solar cell element. This deterioration is caused by the reduction in the transmittance of the surface protective member which occurs when the protective member is yellowed or clouded as a result of deteriorated of the same.

Efforts have been thus devoted in developing fluoropolymer films having increased stability and weatherability.

As for the thermoplastic resin used as filler tie-layer suitable for adhering and protecting the solar cell element in combination with the fluorine-containing polymer film, fluorine-containing resins have been also proposed in the past.

U.S. Pat. No. 4,578,526 (MATSUSHITA ELECTRIC INDUSTRIAL CO.) Mar. 25, 1986 discloses a solar module comprising a photovoltaic cell array on a glass substrate and a resin layer coated thereon, said resin layer being made of a fluoropolymer which is a derivative of a compound comprising a perfluoroalkylene group and active hydrogen atoms, cured with melamine, methyl melamine or compounds containing isocyanate groups.

U.S. Pat. No. 5,466,301 (TEXAS INSTRUMENTS INCORPORATED) Nov. 14, 1995 discloses a flexible cover for a flexible solar cell, able of protecting the cell from the environment and increasing cell's efficiency, said cover being a flexible protective layer of a light-transparent fluoropolymer material, such as TEFZEL® fluoropolymer, bound to the solar cell via an adhesive, preferably an ethylene vinyl acetate tie-layer.

U.S. Pat. No. 5,530,264 (CANON KABUSHIKI KAISHA) Jun. 25, 1996 discloses a photoelectric conversion device comprising:

(a) a photoelectric conversion element;

(b) a transparent resin layer (filler layer) comprising a fluorine-based resin, in particular a chlorotrifluoroethylene/vinyl ether or vinyl ester copolymer, crosslinked with a peroxide; and (c) a transparent surface layer, e.g. a PVDF film or an ECTFE film, generally submitted to surface treatment for achieving adhesion to layer (b).

U.S. Pat. No. 5,578,141 (CANON KABUSHIKI KAISHA) Nov. 26, 1996 discloses a solar cell module in which at least the light receiving surface side of the photovoltaic element is coated with filler material, said filler material being made of a composition comprising vinylidene fluoride copolymer and acrylic resin. A surface protective coating may be present, comprising either vinylidene fluoride copolymer or ethylene/tetrafluoroethylene copolymer.

U.S. Pat. No. 5,582,653 (CANON KABUSHIKI KAISHA) Dec. 20, 1996 discloses a solar cell module comprising a photovoltaic element coated with a transparent filler layer and a transparent surface layer, said transparent surface layer comprising a fluororesin chosen among ethylene/chlorotrifluoroethylene copolymer (ECTFE); poly(chlorotrifluoroethylene) (PCTFE); ethylene/tetrafluoroethylene copolymer (ETFE); tetrafluoroethylene/perfluoroalkylvinylether copolymer (PAVE); tetrafluoroethylene/hexafluoropropylene copolymer (FEP) and an ultraviolet absorver dispersed therein.

U.S. Pat. No. 5,597,422 (CANON KABUSHIKI KAISHA) Jan. 28, 1997 discloses a light-transmissive resin-sealed semiconductor comprising a front surface filler and a front surface film. Surface filler serving for covering concavities and convexities of photovoltaic element and providing adhesion to both the element and the surface film is a cross-linked fluoropolymer comprising vinylidene fluoride (VDF) and hexafluoropropylene (HFP) as main monomers. Front surface film is PVDF or ECTFE.

U.S. Pat. No. 5,660,645 (KANON KABUSHIKI KAISHA) Aug. 26, 1997 discloses a solar cell module comprising, inter alia, a transparent surface film having weatherability and resistance to soiling, said surface film being made of polytetrafluoroethylene (PTFE), polyvinyl fluoride or polyvinylidene fluoride.

U.S. Pat. No. 6,331,673 (CANON KABUSHIKI KAISHA) Dec. 18, 2001 discloses a solar cell module comprising a solar cell element and at least a surface side covering material positioned on the light receiving face, said surface side covering material comprising:
a filler;
a non-woven glass fibres member;
a surface protective film, which can be notably made of a fluororesin, e.g. polyvinylidene fluoride, polyvinyl fluoride, tetrafluoroethylene-ethylene copolymer.

U.S. Pat. No. 6,340,403 (THE REGENTS OF THE UNIVERSITY OF CALIFORNIA) Jan. 22, 2002 discloses a solar cell module comprising fluoropolymer and adhesive layers produced by lamination, said fluoropolymer being chosen among ethylene-chlorotrifluoroethylene copolymer, polyvinyl fluoride, polyvinylidene fluoride, ethylene-tetrafluoroethylene copolymer, polytetrafluoroethylene and polyfluoroalkoxy.

US 2004261836 (CANON KABUSHIKI KAISHA) Nov. 26, 1996 discloses a solar cell module comprising a solar cell element, and a front surface member provided so as to cover a light incidence surface of the solar cell element to provide an outermost surface of the solar cell module, wherein the front surface member comprises a fluoride polymer film having a light incidence surface subjected to a discharge treatment, said fluoride polymer film being chosen among polyvinylidene fluoride (PVDF), polyvinyl fluoride (PVF), ethylene-tetrafluoroethylene copolymer (ETFE), polychlorotrifluoroethylene (PCTFE), chlorotrifluoroethylene-ethylene copolymer (ECTFE), perfluoro(alkyl vinyl ether)-tetrafluoroethylene copolymer (PFA), hexafluoropropylene-tetrafluoroethylene copolymer (FEP), tetrafluoroethylene-hexafluoropropylene-vinylidene fluoride copolymer, and the mixtures of the two or more thereof.

US 2005178428 (SOLAR ROOFING SYSTEMS INC) Aug. 18, 2005 discloses a photovoltaic system comprising a top transparent protective layer, said layer being a dirt-repellent, durable and weather resistant fluoropolymer film, fasten to the photovoltaic element through an adhesive tie-layer (e.g. a hot melt adhesive, like ethylene-vinylacetate). The fluoropolymer film may be made from any of the following compounds: ethylene-tetrafluoroethylene (ETFE), fluorinated ethylene propolyne (FEP), perfluoro alkoxy (PFA), tetrafluoroetylene/hexafluoroproplyne/vinyladine fluoride (THV), polyvinylidene fluoride or any other highly transparent compound exhibiting UV stable/resistant characteristics.

EP 1245657 A (DAIKIN INDUSTRIES) Oct. 2, 2002 discloses an adhesive material made of a fluoropolymer comprising a carboxylic acid halide or a carbonate group, which can be notably a TFE/perfluoroalkylvinylether (PAVE) copolymer comprising 3 to 30% moles of PAVE having formula $CF_2=CF-OR_f$, $R_f$ being a perfluoroalkyl $C_1 \div C_5$ group, which can be notably laminated onto a layer comprising a silicon-based material (e.g. single crystal or polycrystalline silicon or amorphous silicon) for imparting weatherability, soil releasability and damage prevention e.g. in a solar cell module having surface or back covered with said laminate.

No material is known, however, which simultaneously gives adequate insulation, weatherability, flexibility and impact strength, stain resistance, and adhesion to photovoltaic element, in the aforementioned surface coating or filler constitution, especially in the case where the solar cell is exposed to a natural environment for a long time, e.g. twenty years or more. As solar incident radiation indeed comprises a non negligible amount of radiation having wavelength in the U.V. region, it is also mandatory for this material to possess outstanding U.V. resistance.

Fluororesins of the prior art, when used as the outermost surface layer, lose weatherability, often owing to loss of stabilizers contained therein by decomposition by U.V. light, water or heat, by volatilization or elution by heat or water for a long term of outdoor exposure of twenty years or more, resulting in deterioration of the solar cell. Generally, resins become colored under action of U.V. light, ozone, nitrogen oxides, or heat. In particular, tandem junction laminated photoactive semiconductor layers, for which a non-monocrystalline semiconductor, preferably an amorphous silicon semiconductor is used, are greatly adversely affected in conversion efficiency by discoloration of surface coating material. More specifically, a tandem laminated photovoltaic member generates electricity in each of the laminated photoactive semiconductor layers respectively at different wavelengths of light. Therefore, if shorter wavelengths of light are absorbed by discoloured surface coating material, the photoactive semiconductor layer absorbing the shorter wavelengths of light generates less electric current, and consequently the other photoactive semiconductor layers operate under current-limiting conditions to greatly lower the overall conversion efficiency of the photovoltaic member.

The above problem is more significant in solar cell modules having no cooling means and in modules integrated with building materials such as a roof exposed to high temperatures. At a module temperature of 80° C. or higher, the surface coating material of the module is discoloured at a higher discolouring rate.

Moreover, solar cell modules of the prior art often requires complicated manufacturing processes involving the use of several different chemicals able to provide for polymer layers fulfilling all above mentioned, sometimes conflicting, requirements. In particular, use of adhesive and tie layer can be tedious and exposes the solar cell module to additional discolouring phenomena, as described here above, as the adhesive of the prior art generally comprise recurring units derived from hydrogenated monomers having poor U.V. resistance.

BRIEF DESCRIPTION OF DRAWINGS

FIG. 1 shows an apparatus for determining clarity in accordance with aspects of the present invention;

FIGS. 2(A) and 2(B) show an apparatus and process for forming an assembly in accordance with aspects of the present invention; and FIGS. 3(A) and 3(B) show an apparatus and process for powder coating a photovoltaic element to obtain a solar sell module in accordance with aspects of the present invention.

DISCLOSURE OF INVENTION

An object of the present invention is thus to provide a solar cell module having suitable insulation capabilities, excellent weather resistance, heat resistance, adhesion to the photovoltaic element, said module being capable of withstand over a long period of time, minimizing deterioration in performances due to moisture permeability and/or discoloration, enabling access to maximum photoelectric conversion efficiency thanks to increased transparency in the whole visible spectrum and still maintaining adequate mechanical properties, so that suitable anti-scratch and impact resistance can be guaranteed to the photovoltaic active element.

The solar cell module of the present invention comprises at least one photovoltaic element encapsulated between a front layer on its light receiving surface side and a back layer, said front layer comprising at least one layer comprising a tetrafluoroethylene (TFE) polymer [polymer (F)], said polymer (F) comprising:
recurring units derived from TFE; and
from 15 to 25% wt of recurring units derived from at least one perfluoromonomer [monomer (CM)] chosen among:
(i) perfluoroalkylvinylethers complying with formula $CF_2=CFOR_{f1}$, in which $R_{f1}$ is a $C_1$-$C_6$ perfluoroalkyl, e.g. —$CF_3$, —$C_2F_5$, —$C_3F_7$, and/or
(ii) perfluoro-oxyalkylvinylethers complying with formula $CF_2=CFOX_0$, in which $X_0$ is a $C_1$-$C_{12}$ perfluorooxyalkyl having one or more ether groups, like perfluoro-2-propoxy-propyl; and
(iii) mixtures thereof.

Thanks to the use as encapsulating material of a fluoropolymer like polymer (F) possessing outstanding optical properties (excellent transparency) coupled with an outstanding weatherability and U.V. resistance, as well as fluoropolymer typical dielectric and moisture barrier properties, the solar module can withstand operations over a long period of time, with practically no deterioration in performances due to moisture permeability and/or discoloration, thus enabling access to maximum photoelectric conversion efficiency thanks to increased transparency in the whole visible spectrum, as well as in the IR and UV regions, which are also known as participating in photovoltaic effect.

Moreover, due to the mechanical properties of such material (including reasonable modulus and deformation at yield as well as outstanding flexural modulus and fatigue resistance), an effective protection of the photoactive element is achieved, with no need of supplemental filler material.

Other objects of the invention are a process for manufacturing the solar cell module as above detailed, and the use of the solar cell module for producing energy, and in particular for producing energy in a flying object.

Front layer comprises advantageously at least 50% wt, preferably at least 70% wt, more preferably at least 90% wt of polymer (F).

The front layer can comprise in addition to polymer (F) other components, e.g. polymeric components, fillers, additives and the like.

Nevertheless, it is preferred that the front layer consists essentially of polymer (F), that Is to say that even if other components are present, they do not substantially changes advantageous properties of the polymer (F).

Fillers and/or additives may nevertheless be present, provided that they do not interfere with light transmission. Fillers such as inorganic oxides e.g. silica, $TiO_2$, ITO can be used, as they can improve at the same time adhesion to the cell and moisture vapour and gas barrier properties. Typically, primary particles of filler having diameter of no more than approximately one fifth of the visible light wavelength (e.g. particles having diameter of less than 100 nm) do not contribute significantly to light scattering. It is thus preferred to use above mentioned fillers as particles having average size of less than 100 nm.

Thickness of the front layer is not particularly limited, provided that suitable insulation and mechanical protection is guaranteed to the photovoltaic element.

Amount of monomer (CM) in polymer (F) is particularly critical, as only in the claimed range it is possible to obtain suitable optical and mechanical properties.

Monomer (CM) of the polymer (F) is preferably selected among perfluoroalkylvinylethers complying with formula $CF_2=CFOR_{f1}$, in which $R_{f1}$ is a $C_1$-$C_6$ perfluoroalkyl Monomer (CM) is more preferably selected among perfluoroalkylvinylethers complying with formula $CF_2=CFOR_{f1'}$, in which $R_{f1'}$ is —$CF_3$ (MVE), —$C_2F_5$ (EVE), or —$C_3F_7$ (PVE).

Monomer (CM) is most preferably $CF_2=CFOCF_3$ (MVE).

Preferably polymer (F) of the invention is free from recurring units other from those derived from TFE and comonomers (i) and/or (ii) as above detailed.

Thus, polymer (F) preferably consists essentially of:
recurring units derived from TFE; and
from 15 to 25% wt of recurring units derived from a monomer (CM) chosen among:
(i) perfluoroalkylvinylethers complying with formula $CF_2=CFOR_{f1}$, in which $R_{f1}$ is a $C_1$-$C_6$ perfluoroalkyl, e.g. —$CF_3$, —$C_2F_5$, —$C_3F_7$, and/or
(ii) perfluoro-oxyalkylvinylethers complying with formula $CF_2=CFOX_0$, in which $X_0$ is a $C_1$-$C_{12}$ perfluorooxyalkyl having one or more ether groups, like perfluoro-2-propoxy-propyl; and
(iii) mixtures thereof.

The term "consisting essentially of" is understood to mean that the polymer chain is essentially made of recurring units as above detailed. Moieties like end-groups, chain defects, entities derived from other polymerization ingredients like initiators, chain transfer agents can be nevertheless present in polymer (F).

Polymer (F) is advantageously semi-crystalline.

The term semi-crystalline is intended to denote a polymer (F) which possesses a detectable melting point. It is generally understood that a semi-crystalline polymer (F) possesses a heat of fusion determined according to ASTM D 3418 of advantageously at least 0.4 J/g, preferably of at least 0.5 J/g, more preferably of at least 1 J/g.

Semi-crystalline polymers (F) have significant advantages over amorphous products, as they exhibit the required properties, and in particular suitable mechanical properties without additional crosslinking treatments.

Excellent results were obtained when polymer (F) had a heat of fusion of 5 to 25 J/g, preferably of 8 to 15 J/g, most preferably of 8 to 11 J/g. Polymers (F) complying with such requirement were found to well behave as protective layer in solar cell modules, as they possess at the same time suitable mechanical resistance but also outstanding transparency.

Polymer (F) advantageously possesses a melting point ($T_{m2}$) from 215° C. to 230° C., measured according to ASTM D 3418.

It is essential for polymer (F) to have an amount of recurring units derived from monomer (CM) comprised from 15 to 25% wt.

When the polymer (F) comprises less than 15% wt of recurring units derived from monomer (CM), its optical properties are poor and material lacks of suitable transparency.

When polymer (F) comprises more than 25% wt of recurring units derived from monomer (CM), its mechanical properties are poor and the material cannot provide for suitable protection the photovoltaic element.

Polymer (F) comprises at least 15%, preferably at least 16%, more preferably at least 17% by weight of recurring units derived from monomer (CM).

Polymer (F) comprises at most 25%, preferably at most 24%, more preferably at most 23% by weight of recurring units derived from monomer (CM).

Excellent results have been obtained with a polymer (F) comprising from 17 to 23% wt of recurring units derived from MVE.

Polymer (F) possesses advantageously a refractive index $n_D$ of from 1.33 to 1.35.

For the avoidance of doubts, $n_D$ is the refractive index at a temperature of 25° C. at the Fraunhofer "D" line, the centre of the yellow sodium double emission at 589.29 nm wavelength.

The polymer (F) of the invention is advantageously transparent.

The term transparent, used as synonymous of clear, is a measure of the ability of a material to transmit image-forming light. It may be thought of as the distinctness with which an object appears when viewed through the material. Therefore, transparency depends on the linearity of the passage of light rays through the material.

Generally, when light interacts with matter, it can be reflected, absorbed, scattered, or transmitted. An object is generally described as "transparent" if a significant fraction of the incident light is transmitted through the object. An object is considered "opaque" if very little light is transmitted through it. And object is considered "translucent" if some light passes through but not in a way that a coherent image can be seen through it. Typically, this occurs if light must take a circuitous path through the object, scattering from embedded particles, defects or grain boundaries.

Thus, the common characteristic of the inventive polymer (F) that makes it transparent is that it (1) does not reflect much (i.e. advantageously less than 50%, preferably less than 30%) of incoming light from its surface, (2) does not absorb much (i.e. advantageously less than 50%, preferably less than 30%) of said incoming light, and (3) is uniform enough not to scatter much (i.e. advantageously less than 50%, preferably less than 30%) of said incoming light.

According to ASTM D 1746, transparency or clarity (clarity, hereinafter) can be determined by small-angle scattering. A typical assembly for determining clarity is sketched in FIG. 1. A light source (1) emits a light radiation which is passed though a collimator (2) to guide incident beam towards the sample specimen (4); intensity of incident light beam (3) $I_i$ and of transmitted light (8) deflected of less than 0.1 degree $I_r$ is measured; an aperture (7) avoids reflected (5) and scattered or deflected (6) light to reach the detector (9).

Clarity is thus expressed as percentage as follows:

$$\% T = \frac{I_r}{I_i} \times 100$$

Polymer (F) has a clarity of advantageously more than 60%, preferably of more than 70%, more preferably more than 80%, still more preferably of more than 82%, even more preferably of more than 85%, according to ASTM D 1746, when measured on sheets having a thickness of 5 mils (127 µm).

Excellent results have been obtained with polymer (F) having a clarity of more than 80%, when measured on sheets having a thickness of 5 mils (127 µm).

When the polymer (F) of the invention has a transparency of less than 60%, when measured on sheets having a thickness of 5 mils (127 µm), its performances in photovoltaic element encapsulation are relatively poor, because of the subsequent loss of efficiency of the solar cell module.

Moreover, the polymer (F) as above defined has advantageously outstanding UV resistance with no need of additives or stabilizers, so that transparency can be maintained at outstanding values even after long period of exposition to UV radiation.

To this aim it is particularly advantageous that the polymer (F) is substantially free from unstable end-groups of —COF type, that is to say that it possesses an amount of unstable end-groups of —COF type of less than 0.1 mmol/kg, preferably of less than 0.05 mmol/Kg.

To the purposes of the invention, the term "unstable end groups of —COF type" is intended to encompass fluoroacyl groups and derivatives thereof, such as —COW groups, wherein W represent Cl, Br, $NH_2$, OM, with M being a hydrogen atom or a metal, preferably H or an alkaline metal.

The amount of unstable —COF-type end groups can be notably determined by FT-IR spectrometry, according to the method detailed here below.

A polymer (F) sample, submitted to a preliminary drying at 90° C. until constant weight, is compression moulded into a film having an average thickness between 50 and 300 µm. An FT-IR spectrum between 4000 $cm^{-1}$ and 400 $cm^{-1}$ is recorded, e.g. by using a Nicolet® Nexus FT-IR equipment (256 scannings, resolution 2 $cm^{-1}$), from said film.

The optical densities of absorption bands in the spectral region between 1900 and 1700 $cm^{-1}$ are measured and converted into values expressed as mmol/kg of polymer (F) using the extinction coefficients reported in Table 1, page 73 of the paper PIANCA, M., et al. End groups in fluoropolymers. *J. Fluorine Chem.* 1999, vol. 95, p. 71-84. The sensitivity limit of this method is of about 0.05 mmol/Kg.

The Applicant has found that these unstable end-groups detrimentally interact with light in the near-U.V. wavelengths, causing absorption at about 200 to 220 nm and catalyzing decomposition and discoloration phenomena. It is thus recommended for both increased efficiency of the solar cell module and improved stability and resistance against discolouring phenomena to use polymer (F) as above detailed, substantially free from unstable —COF-type end groups.

Polymer (F) substantially free from unstable —COF-type end groups can be obtained either by choosing appropriate polymerization conditions and ingredients or by submitting polymer (F) not fulfilling with this requirement to appropriate stabilization steps, e.g. by fluorination.

Thus, polymer (F) possesses a transmittance in the near U.V. region (λ=254 nm) of more than 60%, preferably of more than 70%, more preferably more than 80%, still more preferably of more than 82%, even more preferably of more than 85%, when determined on a film having a thickness of 50 µm.

The polymer (F) advantageously possesses a loss in transmittance after 1000 h of exposure to mercury-lamp U.V. radiation (254 nm) under the form of a film having a thickness of 5 mils (127 µm) of less than 10%, preferably less than 5%.

Similarly, polymer (F) advantageously possesses a loss in clarity after 1000 h of exposure to mercury-lamp U.V. radiation (254 nm) under the form of a film having a thickness of 5 mils (127 µm) of less than 10%, preferably less than 5%.

In order to easily process polymer (F) under the form of films or sheets suitable for being used for encapsulation or to effectively spray-coating polymer (F) on the photovoltaic element, it is preferred that the polymer (F) possesses a melt flow index (300° C./5 kg) of from 5 to 30 g/10 min, more preferably from 10 to 20 g/10 min when measured according to ASTM 1238-01.

The photovoltaic elements of the solar cell module of the invention are well known to those skilled in the art; said photovoltaic element is generally formed of a semiconductor photoactive layer (i.e. the layer endowed of photoelectric conversion property) sandwiched between an electroconductive substrate and a transparent conductive layer.

The electroconductive substrate serves as a base member for the photovoltaic element as well as a lower-side electrode. Examples of materials thereof include silicon, tantalum, molybdenum, tungsten, stainless steel, aluminium, copper, titanium, carbon sheet, lead-plated steel, and resin films, and ceramics and glass having an electroconductive layer formed thereon. On the above electroconductive substrate, a backside reflection layer may be formed from a metal layer, a metal oxide layer, or a lamination thereof. The metal layer can be formed from Ti, Cr, Mo, W, Al, Ag, Ni, Cu, and the like. The metal oxide layer can be formed from $ZnO$, $TiO_2$, $SnO_2$, $In_2O_3$—$SnO_2$ (ITO), and the like. The metal layer and the metal oxide layer may be formed by resistance heating vapor deposition, electron beam vapor deposition, sputtering, or like method.

The semiconductor photoactive layer is intended to perform photovoltaic conversion. The specific materials used for forming such semiconductor photoactive layer include single crystal silicon semiconductor, non-single crystal silicon semiconductor (e.g. an amorphous silicon (a-Si) semiconductor or a polycrystalline silicon semiconductor), compound semiconductors and junctions such as $CuInSe_2$, $CuInS_2$, GaAs, $CdS/Cu_2S$, CdS/CdTe, CdS/InP, and $CdTe/Cu_2Te$, and organic semiconductors such as polymers and small-molecule compounds like polyphenylene vinylene, copper phtalocyanine (a blue or green organic pigment) and carbon fullerenes.

The semiconductor photoactive layer formed of either of the above semiconductor has generally a laminated structure with a "pn junction", "pin junction" or Schottky junction.

A transparent electroconductive layer serves as an upper-side electrode (i.e. the light receiving surface). Specific examples of the material therefore include $In_2O_3$, $SnO_2$, $In_2O_3$—$SnO_2$ (ITO), ZnO, $TiO_2$, $Cd_2SnO_4$, crystalline semiconductor layers doped with a high concentration of an impurity, like notably fluorine-doped tin oxide ($SnO_2$:F, or "FTO"), doped zinc oxide (e.g.: ZnO:Al) and flexible organic conductors, like, e.g. carbon nanotube networks embedded in a transparent polymer matrix.

The layer may be formed by resistance-heating vapor deposition, sputtering, spraying, chemical vapour deposition (CVD), impurity diffusion, and like methods. In case of flexible organic conductors, typical polymer processing technologies are also available, including laminating, casting, extrusion and the like.

On the transparent electroconductive layer, a grid type collecting electrode (grid) may be provided in order to efficiently collect the generated current. Specific examples of the material for the collecting electrode include Ti, Cr, Mo, W, Al, Ag, Ni, Cu, Sn, and alloys thereof, and an electroconductive paste such as silver paste. The collecting electrode may be formed by sputtering, resistance heating, and CVD employing a mask pattern; metal film deposition and subsequent etching for patterning; direct grid electrode pattern formation by photo-assisted CVD; formation of a negative pattern mask of the grid electrode and subsequent metal plating; printing with electroconductive paste, bonding of metal wires, and like methods. The electroconductive paste generally includes a dispersion of powder of silver, gold, copper, nickel, carbon or the like in a polymeric binder. The polymeric binder includes polyester resins, epoxy resins, acrylic resins, alkyd resins, polyvinyl acetate resins, rubbers, urethane resins, and phenol resins. Otherwise, a wire made of a metal such as Cu may be provided on the transparent conductive layer.

Solar cell module is generally equipped with output terminals for extracting photovoltaic current. Said output terminals are typically in electric connection with the conductive substrate and the collecting electrode, respectively. Generally a metal piece such as a copper tab can be used as output terminal at the conductive substrate side, connected to the conductive substrate by spot welding or soldering. On the other hand, a metal may be electrically connected to the collecting electrode by means of conductive paste or solder.

A plurality of solar cell modules as above detailed may be provided, wherein photovoltaic elements can be connected in series or in parallel according to the desired voltage or current.

The back layer is intended for maintaining electric insulation between the conductive substrate of the photovoltaic element and the exterior. The back layer is generally made of a flexible material which ensures sufficient electric insulation with the conductive substrate of the photovoltaic element.

It is preferred that the back layer comprises, preferably consist essentially of, a fluoropolymer compatible with polymer (F).

The term "compatible" is intended to denote the capability of said fluoropolymer of yielding a homogeneous phase when mixed in all proportions with polymer (F), so as only one glass transition temperature ($T_g$) is detected in said homogeneous phase by differential scanning calorimetry (DSC) according to ASTM D 3418.

Examples of fluoropolymers compatible with polymer (F) are notably per(halo)fluoropolymers comprising (preferably consisting essentially of) recurring units derived from one or more than one monomer selected among:

$C_2$-$C_8$ per(halo)fluoroolefins, such as tetrafluoroethylene, hexafluoropropene, chlorotrifluoroethylene;

per(halo)fluoroalkylvinylethers complying with formula $CF_2$=$CFOR_{f2}$ in which $R_{f2}$ is a $C_1$-$C_6$ per(halo)fluoroalkyl, e.g. $CF_3$, $C_2F_5$, $C_3F_7$;

$CF_2$=$CFOX'_0$ per(halo)fluoro-oxyalkylvinylethers, in which $X'_0$ is a $C_1$-$C_{12}$ per(halo)fluorooxyalkyl having one or more ether groups, like perfluoro-2-propoxypropyl;

per(halo)fluorooxyalkylvinylethers complying with formula $CF_2$=$CFOCF_2OR_{f3}$ in which $R_{f3}$ is a $C_1$-$C_6$ per(halo)fluoroalkyl, e.g. $CF_3$, $C_2F_5$, $C_3F_7$ or a $C_1$-$C_6$ per(halo)fluorooxyalkyl having one or more ether groups, like —$C_2F_5$—O—$CF_3$;

functional per(halo)fluoroalkylvinylethers complying with formula $CF_2=CFOY_0$, in which $Y_0$ is a $C_1$-$C_{12}$ per(halo)fluoroalkyl or a $C_1$-$C_{12}$ per(halo)fluorooxy-alkyl having one or more ether groups and $Y_0$ comprising a carboxylic or sulfonic acid group, in its acid, acid halide or salt form;

fluorodioxoles, especially perfluorodioxoles.

According to a preferred embodiment of the invention, the back layer of the solar cell module of the invention comprises at least one polymer (F) as above detailed. Polymer (F) of the back layer advantageously possesses all features as above detailed for polymer (F) comprised in the front layer.

Said back layer can also comprise additional components, e.g. fillers. As filler, use can be made of oxides, e.g. $SiO_2$, $TiO_2$, pigments (organic and inorganic) and the like. Suitable fillers are in particular white fillers which can increase reflection of light back to the photovoltaic element. Preferred filler is thus $TiO_2$.

Amounts of filler, and in particular of $TiO_2$, which have been found particularly useful to the purpose of the invention range from 5 to 15% wt.

Another object of the invention is a process for manufacturing the solar cell module as above described.

The process of the invention can be carried out using either a pre-formed sheet comprising polymer (F) as a precursor of the protective layer or forming said layer directly from polymer (F), e.g. from powder or from latex of polymer (F).

According to a first embodiment of the invention, the process advantageously comprises the following steps:

(i) providing a substantially bidimensional photovoltaic element having a surface (S);

(ii) providing a sheet comprising polymer (F) as above detailed having a surface (S'), and a back layer as above described having a surface (S"), surfaces (S') and (S") being suitable to extend beyond perimeter of surface (S);

(iii) assembling said sheet with said photovoltaic element and a back layer so that the light receiving surface of the photovoltaic element is entirely covered by said sheet and the back surface of the photovoltaic element is entirely covered by said back layer, and that said sheet and said back layer are in intimate contact all around the periphery of the surface (S) of the photovoltaic element, so as to provide an assembly;

(iv) submitting said assembly to a thermal treatment at a temperature of at least 230° C.

The sheet comprising polymer (F) has a thickness of advantageously at least 15 µm, preferably at least 20 µm, more preferably at least 25 µm.

The sheet comprising polymer (F) has a thickness of advantageously at most 250 µm, preferably at most 200 µm, more preferably at most 150 µm.

The sheet comprising polymer (F) can be manufactured via all suitable techniques well-known to those skilled in the art, including casting, extrusion moulding, film blowing and the like. Preferably, said sheet is obtained by extrusion.

The sheet is advantageously submitted to a thermal treatment before steps (i) to (iv) as above detailed.

A treatment at a temperature of at least 200° C. for duration of at least 5 minutes will be particularly advantageous. Such treatment is generally intended to achieve a proper dimensional stability of the sheet comprising polymer (F).

Particularly good results have been obtained when the sheet of polymer (F) was submitted to a treatment at a temperature of 210° C. for 40 minutes.

Assembling step (iii) can be realized according to methods well known in the art. Particular procedure is not critical provided that a good superposition between the three elements is achieved. Generally, two support members will be used for retaining the assembly. Suitable retaining means include, for instance, PTFE members or polyimide (e.g. KAPTON® aromatic PI) members. Any other material possessing adequate anti-stick properties and thermal resistance can be used for the retaining means. PTFE members are particularly advantageous in view of their anti-stick properties and thermal stability.

Thermal treatment can be carried out using standard heating means. Generally, the assembly obtained in step (iii) can be introduced in a suitable oven maintained at the required temperature. Otherwise, retaining means as above detailed can comprise appropriate heating means, so that they advantageously supply heat to the assembly and they optionally apply pressure on the assembly so as to facilitate adhesion between the front layer and the back layer.

It is essential that the thermal treatment comprises heating the assembly at a temperature of at least 230° C., i.e. at a temperature exceeding melting point of polymer (F). Melting polymer (F) while maintaining the different layers coherently assembled advantageously enables sheet comprising polymer (F) to interpenetrate the surface asperities and protrusions of the photovoltaic elements assuring a good adhesion to said element with no need of additional tie layer, so that a proper front layer is formed in intimate contact with the light incident surface of the photovoltaic element. Via this thermal treatment, a good adhesion between the front layer and the back layer is also achieved.

The skilled in the art will optimize thermal treatment by choosing the temperature as a function of the melting point of polymer (F). Generally, heating at a temperature T1 exceeding by at least 20° C., preferably by at least 25° C., more preferably 30° C. the melting point of polymer (F) will be particularly advantageous in order to reasonably lower melt viscosity of the polymer (F) and making it flowing within the interstices and asperities of the light incident surface of the photovoltaic element.

Particularly good results have been obtained by choosing a thermal treatment comprising heating at a temperature of advantageously at least 240° C., preferably 250° C., for duration of advantageously at least 10 minutes, preferably at least 20 minutes, more preferably at least 30 minutes.

Also, the thermal treatment can be followed by a controlled cooling step (v). Cooling conditions will be advantageously chosen so as to release all possible internal tension in the front layer, so as to obtain dimensional stability and avoiding risks of uncontrolled shrinkage. Particularly good results have been obtained by choosing a thermal treatment wherein the assembly, after being heated at a first temperature $T_1$, is cooled:

from $T_1$ to a second temperature $T_2$ equal to $T_1$–100° C. with a cooling rate of less than 30° C./min, preferably of less than 15° C./min;

from $T_2$ to room temperature with a cooling rate of less than 15° C., preferably of less than 10° C./min.

According to a second embodiment of the invention, the process advantageously comprises the following steps:

(i) providing a substantially bidimensional photovoltaic element;

(ii) heating said photovoltaic element at a temperature of at least 230° C.;

(iii) spraying the heated surfaces of the photovoltaic element with a composition (C) comprising polymer (F) so as to homogeneously coat the photovoltaic element.

Composition (C) can be a dry or a wet composition.

Standard techniques well known to those skilled in the art will be suitable for this second embodiment of the invention.

Among the various standard techniques, those employing polymer dispersions in organic solvents or their aqueous latices and the electrostatic powder coating (EPC) can be mentioned.

Should the composition (C) be a wet composition, various conventional coating methods may be employed. Examples are dipping method, spray method, roll coat method, doctor blade method and flow coat method.

Should the composition (C) be a dry composition, the electrostatic powder coating (EPC) method, wherein the particles of composition (C) are electrostatically charged and deposited on the heated and earthed surfaces of the substantially bidimensional photovoltaic element, have acquired a remarkable importance.

Preferably, the process according to this second embodiment of the invention comprises step (iii) of spraying by electrostatic powder coating (EPC).

The invention also pertains to the use of the solar cell module as above described for producing current to external sources, e.g. for transport, stationary and portable applications—industrial use and consumer products.

The solar cell module of the invention can be advantageously used for powering a flying module, e.g. an aircraft.

An aircraft is a heavier-than-air flying craft. The term fixed-wing aircrafts is used to designate aircraft wherein the movement of the wings in relation to the aircraft is not used to generate lift. The term rotary-wing aircraft is used to designate aircrafts where the movement of the lift surfaces of the wings relative to the aircraft generates lift.

The solar cell module of the invention is particularly advantageous for powering a fixed-wing aircraft, commonly known as airplane.

Generally, the wings of the aircraft comprise the solar cell modules according to the invention. Said solar cell modules cover partially or totally the light incident surface of said wings.

According to a particular embodiment of the invention, the solar cell modules of the invention power one or more than one spinning propeller moving air for generating a forward thrust in the fixed-wing aircraft.

The invention will be now described in more details with reference to the following examples, whose purpose is merely illustrative and not limitative of the scope of the invention.

EXAMPLE 1

Manufacture of a Polymer (I)

In a 22 litres autoclave the following reagents were charged:
14.5 litres of demineralised water;
90 ml of a solution made of: 30.6% of Galden® mono acid, 17% of NH$_4$OH, 34% of H$_2$O and 18.4% of Galden® D02.

The autoclave, stirred at 500 rpm, was heated to a temperature of 75° C. A water based solution with 9.5 g/liter of KPS (potassium persulfate) was added in a quantity of 80 ml and the reactor was evacuated. A pressure of 0.43 bar of ethane was introduced in the autoclave; a partial pressure of MVE of 7.58 bar was introduced and then the total pressure was raised till 21 Bar abs by addition of the monomeric mixture (TFE/MVE) in molar ratio 90/10 TFE/MVE and said internal pressure was kept constant till the conversion of 6600 g of monomeric mixture.

The reaction was stopped after 375 min by stopping the stirring, cooling the autoclave and reducing the internal pressure by venting the TFE; a total of 6600 g of polymer is recovered. The produced latex was found to have a concentration of 33.0% by weight.

The latex was kept under nitrogen bubbling for 16 hours to strip away residual monomers from the polymerization, and then stored in a plastic tank. The coagulum was obtained by addition of HNO$_3$ to the lattice. The polymeric powder was precipitated. The excess of water was removed by stripping in an oven at 120° C.

The polymer was found to have a melting point of 221.0° C., a heat of fusion of 9.8 J/g, as measured by DSC according to ASTM D 3418, a weight content of MVE of about 18% wt, and a concentration of unstable end-groups of —COF type of less than 0.1 mmol/kg.

Refractive index of the polymer was found to be at 25° C. of 1.342.

The polymer was also found to possess a MFI (300° C.; 5 kg) of 14 g/10 min according to ASTM D 1238. Mechanical properties of the polymer obtained were determined according to ASTM D 638, on specimens of V-type, at 23° C. results are summarized in table 1

TABLE 1

| Modulus (MPa) | Stress at yield (MPa) | Deformation at yield (%) | Stress at break (MPa) | Deformation at break (%) |
|---|---|---|---|---|
| 470 | 11.4 | 6.2 | 32.7 | 360 |

EXAMPLE 2

Film Manufacturing (Extrusion)

The extrusion of the polymer obtained as detailed in example 1 was carried out in a conventional film extrusion line. The pellets of the polymer were charged into the hopper of an extruder having a diameter of 45 mm and a screw length of 24 diameters. The barrel of the extruder was heated with four thermal heaters set, starting from the hopper, at 240, 255, 260, 265° C. respectively. The connecting parts between the barrel and the die were hated at 270-275° C., while the die temperature was set at 290-300° C. The die had a width of 950 mm with the lips opening of 0.55 mm. The polymer was extruded at 12 rpm and the line speed was about 1.3 m/min. The temperatures of the calender rolls were set at 130° C.

The polymer was processed yielding a transparent, smooth film with no pinholes or defects, having a thickness of 50 μm.

Said film was found to have a transmittance of U.V. light at a wavelength of 254 nm of 87.5%.

Similarly as described here above, a film having a thickness of 5 mils, corresponding to 127 μm was extruded and was submitted to an aging test under U.V. irradiation. The transmittance of U.V. light having wavelength of 250 nm was determined before and after a 1000 hours exposure to U.V. light at 254 nm.

The loss in transmittance and in clarity after the aging was found to be less than 3%.

Table 2 here below shows results of loss in transmittance in several materials which have been used in the past as protecting layer or top layer in solar cell modules encapsulation. It becomes evident that polymer (F) according to the invention provides outstanding U.V. resistance performances coupled with excellent continued optical properties.

TABLE 2

| Material | Transmittance (%) As such | Transmittance (%) After ageing | Loss in transmittance (%) |
|---|---|---|---|
| Polymer of example 1 | 86.5% | 86.0% | <3% |
| HALAR ® ECTFE | 86.7% | 69.9% | 19% |
| ETFE | 34.6% | 31.0% | 10% |
| FEP | 52.1% | 46.0% | 12% |
| PVDF | 7.2% | 5.4% | 25% |

EXAMPLE 3

Thermal Encapsulation

In a heating press, between two steel plates (1), a silicon-based photovoltaic element (4) was assembled with two portions (3) of the film obtained as described in example 2 and sandwiched between two sheets of PTFE (2), as depicted in FIG. 2(A). The photovoltaic element was previously pretreated at 200° C. for at least 30 minutes in order to eliminate moisture and other contaminants from the silicon layer.

The so-obtained assembly, as depicted in FIG. 2(B), was submitted to the following thermal treatment
1) pre heating of the heating press at 250° C.;
2) introduction of the assembly in the heating press;
3) heating of the assembly from r.t. to 250° C. in around 2 minutes;
4) continuous heating at 250° C. of the assembly with no applied pressure;
5) during 190 sec, heating was pursued by alternatively applying a pressure of 2 bars for 5 seconds and releasing said pressure;
6) heating of the assembly under a pressure of 2 bars during 60 sec.

The assembly was then slowly cooled down at room temperature under pressure, so as to obtain a solar cell module having a photovoltaic element encapsulated between a front layer on its light receiving surface side and a back layer, both made from polymer of example 1 here above.

The solar cell module was found to assure suitable protection to the photovoltaic element and consistent encapsulation of said element with no delamination phenomena.

EXAMPLE 4

Powder Coating

The dry powder of the polymer prepared according to the example 1 was loaded in the reservoir (33) of an electrostatic gun (32), equipped with a compressed air supply (34). A photovoltaic element (31) was heated at 250° C., earthed and the fine powder of polymer of example 1 (35) was sprinkled on the surface of the heated thereon, as depicted in FIG. 3(A) so as to obtain a solar cell module (36) having a photovoltaic element encapsulated between a front layer on its light receiving surface side and a back layer, both made from polymer of example 1 here above.

The solar cell module was found to assure suitable protection to the photovoltaic element and consistent encapsulation of said element with no delamination phenomena.

The invention claimed is:

1. A solar cell module comprising at least one photovoltaic element encapsulated between a front layer on its light receiving surface side and a back layer, said front layer comprising at least one layer comprising a tetrafluoroethylene (TFE) polymer [polymer (F)], said polymer (F) consisting of:
   recurring units derived from TFE; and
   from 15 to 25% wt of recurring units derived from at least one perfluoromonomer selected from the group consisting of:
   (i) perfluoroalkylvinylethers complying with formula $CF_2=CFOR_{f1}$, in which $R_{f1}$ is a $C_1$-$C_6$ perfluoroalkyl; and/or
   (ii) perfluoro-oxyalkylvinylethers complying with formula $CF_2=CFOX_0$, in which $X_0$ is a $C_1$-$C_{12}$ perfluorooxyalkyl having one or more ether groups; and
   (iii) mixtures thereof.

2. The solar cell module of claim 1, wherein the polymer (F) possesses an amount of unstable end-groups of —COF type of less than 0.1 mmol/kg.

3. The solar cell module of claim 2, wherein the polymer (F) comprises from 17 to 23% wt of recurring units derived from MVE.

4. The solar cell module claim 1, wherein the polymer (F) possesses a melting point ($T_{m2}$) from 215° C. to 230° C., measured according to ASTM D 3418.

5. The solar cell module of claim 1, wherein the polymer (F) possesses a melt flow index (300° C./5 kg) of from 5 to 30 g/10 min when measured according to ASTM 1238-01.

6. The solar cell module of claim 1, wherein the back layer comprises a fluoropolymer compatible with polymer (F).

7. The solar cell module of claim 1, wherein the $C_1$-$C_6$ perfluoroalkyl is selected from the group consisting of —$CF_3$, —$C_2F_5$, and —$C_3F_7$.

8. A process for manufacturing the solar cell module according to claim 1. said process comprising forming said polymer (F) into a solar cell front layer on the light receiving surface of a solar cell module.

9. The process of claim 8, comprising the following steps:
   (i) providing a substantially bidimensional photovoltaic element having a surface (S);
   (ii) providing a sheet comprising polymer (F) having a surface (S'), and a back layer having a surface (S"), surfaces (S') and (S") being suitable to extend beyond perimeter of surface (S);
   (iii) assembling said sheet with said photovoltaic element and a back layer so that the light receiving surface of the photovoltaic element is entirely covered by said sheet and the back surface of the photovoltaic element is entirely covered by said back layer, and that said sheet and said back layer are in intimate contact all around the periphery of the surface (S) of the photovoltaic element, so as to provide an assembly; and
   (iv) submitting said assembly to a thermal treatment at a temperature of at least 230° C.

10. The process of claim 9, wherein the thermal treatment (iv) is followed by a controlled cooling step (v) wherein the assembly, after being heated at a first temperature $T_1$, is cooled:
   from $T_1$ to a second temperature $T_2$ equal to $T_1$ −100° C. with a cooling rate of less than 30° C./min;
   from $T_2$ to room temperature with a cooling rate of less than 15° C./min.

11. The process of claim 8 comprising the following steps:
   (i) providing a substantially bidimensional photovoltaic element;
   (ii) heating said photovoltaic element at a temperature of at least 230° C.; and
   (iii) spraying the heated surfaces of the photovoltaic element with a composition (C) comprising polymer (F) so as to homogeneously coat the photovoltaic element.

12. A method for producing current to external sources, said method comprising using solar cell modules according to claim 1.

13. A method for powering a fixed-wing aircraft, said method comprising using solar cell modules according to claim 1.

14. The method according to claim 13, wherein the wings of said aircraft comprise the solar cell modules.

15. The method according to claim 14, wherein the solar cell modules power one or more than one spinning propeller moving air for generating a forward thrust in the fixed-wing aircraft.

* * * * *